United States Patent [19]

Frommeld

[11] Patent Number: 4,749,639
[45] Date of Patent: Jun. 7, 1988

[54] PHOTOSENSITIVE COMPOSITION AND RECORDING MATERIAL WITH PHOTOSENSITIVE POLYMERIC DIAZONIUM SALT AND THERMAL CROSS-LINKABLE COPOLYMER BINDER

[75] Inventor: Hans-Dieter Frommeld, Wiesbaden, Fed. Rep. of Germany

[73] Assignee: Hoechst Aktiengesellschaft, Fed. Rep. of Germany

[21] Appl. No.: 827,163

[22] Filed: Feb. 7, 1986

[30] Foreign Application Priority Data

Feb. 12, 1985 [DE] Fed. Rep. of Germany ....... 3504658

[51] Int. Cl.$^4$ ........................... G03C 1/60; G03C 7/08
[52] U.S. Cl. ..................... 430/175; 430/176; 430/302; 430/330
[58] Field of Search ................ 430/175, 176, 302, 330

[56] References Cited

U.S. PATENT DOCUMENTS

| | | | |
|---|---|---|---|
| 3,679,419 | 7/1972 | Gillich | 430/175 |
| 3,890,152 | 6/1975 | Ruckert et al. | 430/175 |
| 4,275,138 | 6/1981 | Kita et al. | 430/175 |
| 4,288,520 | 9/1981 | Sprintschnik et al. | 430/302 |
| 4,316,949 | 2/1982 | Petrollis et al. | 430/175 |
| 4,339,530 | 7/1982 | Sprintschnik et al. | 430/331 |
| 4,572,887 | 2/1986 | Geissler | 430/288 |

FOREIGN PATENT DOCUMENTS 1154749 6/1969 United Kingdom .
2044788 10/1980 United Kingdom ............... 430/175

Primary Examiner—Charles L. Bowers, Jr.
Attorney, Agent, or Firm—Foley & Lardner, Schwartz, Jeffery, Schwaab, Mack, Blumenthal & Evans

[57] ABSTRACT

A photosensitive composition comprising a polymeric diazonium salt, preferably a diazonium salt polycondensation product, and a polymeric binder possessing lateral crosslinking groups represented by the formula —CH$_2$—OR, wherein R denotes a hydrogen atom, a lower alkyl group, a lower acyl group or a lower hydroxyalkyl group, can be used to produce printing plates which yield considerably increased print runs after being baked at temperatures of 150° C. to 250° C.

12 Claims, No Drawings

PHOTOSENSITIVE COMPOSITION AND RECORDING MATERIAL WITH PHOTOSENSITIVE POLYMERIC DIAZONIUM SALT AND THERMAL CROSS-LINKABLE COPOLYMER BINDER

BACKGROUND OF THE INVENTION

The present invention relates to a negative working photosensitive composition comprising a polymeric diazonium salt and a polymeric binder, and to a recording material prepared therewith which is particularly suitable for producing lithographic printing plates.

It is known to increase the service life (print run) of an offset printing form by baking, i.e., by heating the printing form to a temperature between about 150° C. and 250° C. This process is employed, in particular, for positive working printing plates based on naphthoquinone diazides and, as binders, novolaks or resols (phenol resins), as disclosed by British Patent Specification No. 1,154,749.

Polymeric diazonium salts, particularly diazonium salt polycondensation products, have been employed very successfully as photosensitive compounds in negative working printing plates. But it has been almost impossible heretofore to achieve a substantial increase in print run by baking these plates. In some cases, baking has even led to a decrease in print run, possibly due to a fragmentation of macromolecules in the printing layer.

It has also shown that the phenol resins, and in particular the novolaks, are required as binders in positive working layers in order to achieve an optimum increase in print run. These binders are, however, unsuited in practice for use in the above-mentioned negative working layers. It has even been found that photosensitive compositions comprising an excess of phenol resin and diazonium salts which are per se negative working turn into positive working compositions (see West German Auslegeschrift No. 20 65 732, Examples 54 and 55).

So that negative working printing plates may nevertheless be baked, it has been proposed to reinforce the developed printing plate with a coating of phenol resin-containing lacquer, which lacquer adheres to the image areas only, and then to bake the plate. This method is described in British Patent Specification No. 1,151,199. It has not gained general acceptance, however.

European Patent Application No. 0 111 273 describes a photosensitive composition that comprises a binder which is soluble in aqueous-alkaline solutions, a photosensitive substance and, as the crosslinking agent, a melamine derivative. The preferred binders are novolaks. No satisfactory crosslinking is achieved when customary copolymers of (meth)acrylic acid and (meth)acrylic acid esters are used.

French Pat. No. 2,485,759 recommends epoxy resins as crosslinking additives to diazo-diphenylamine condensation products. Freshly prepared layers of this kind can be successfully baked, but they have a poor shelf life.

West German Patent Application No. P 33 29 443 describes photopolymerizable compositions comprised of polymerizable, ethylenically unsaturated compounds, photoinitiators and polymeric binders. At least part of the binders employed are polymers having crosslinking lateral groups of the formula —$CH_2OR$, in which R denotes an alkyl group, acyl group or hydroxyalkyl group. The disclosed compositions are used for the production of thermally curable solder masks.

SUMMARY OF THE PRESENT INVENTION

It is therefore an object of the present invention to provide a negative working, thermally curable, photosensitive composition suitable for the production of photosensitive recording material.

It is another object of the present invention to provide a photosensitive recording material which si distinguished by good image resolution, good resistance (i.e., high print runs following baking), and good storability in the unexposed state.

In accomplishing the foregoing objects, there has been provided, in accordance with one aspect of the present invention, a photosensitive composition comprising a polymeric diazonium salt and a polymeric binder, said binder possessing lateral crosslinking groups represented by the formula —$CH_2$—OR, wherein R denotes a hydrogen atom, a lower alkyl group, a lower acyl group or a lower hydroxyalkyl group. In one preferred embodiment, the polymeric diazonium salt is a diazonium salt polycondensation product.

In accordance with another aspect of the present invention, there has been provided a photosensitive recording material comprised of a layer support and a photosenstive layer containing the above-described polymeric binder. Preferably, the recording material is a lithographic printing form.

Other objects, features and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

The present invention is based on a photosensitive composition comprised of a polymeric diazonium salt and a polymeric binder. The mixture of the present invention is characterized by the fact that the binder contains lateral crosslinking groups of the formula —$CH_2OR$, in which R denotes a hydrogen atom, a lower alkyl group, a lower acyl group or a lower hydroxyalkyl group. Preferably, the binder is a copolymer that comprises units of the formula

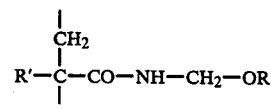

wherein
R' denotes a hydrogen atom or a methyl group and
R has the above-indicated meaning.

In general, preference is given to compounds wherein R is an alkyl group. If R is an alkyl group, it generally contains 1 to 6, preferably 1 to 4, carbon atoms; if R is an acyl group, it generally contains 1 to 4, preferably 1 or 2, carbon atoms.

In addition to the units of the above formula, a suitable copolymer for the present invention may include other units, with preference given to units that yield polymers having a low glass transition temperature (Tg) and that, in particular, contain acrylic or methacrylic acid ester units.

Upon being heated in the presence of polymers with free hydroxyl groups or, preferably, free carboxyl or carbonamide groups, polymers containing the above-described monomer units yield crosslinked products. Therefore, they can be present in a mixture with polymeric binders that carry such substituents. Binders which include both types of functional units in one molecule are preferably employed. Especially suitable are copolymers and, particularly, terpolymers of substituted acrylic or methacrylic acid amides with acrylic or methacrylic acid amide, with acrylic or methacrylic acid, or with alkyl esters of acrylic or methacrylic acid. Special preference is given to methacrylic acid esters, particularly those containing 4 to 12 carbon atoms in their alkyl groups. If acrylic acid esters are used, the alkyl group can be shorter.

Additionally, the polymers employed in the present invention can contain minor amounts of interpolymerized hydroxyalkylacrylates or hydroxyalkyl-methacrylates.

The quantitative proportion of carboxyl group-containing units and/or carbonamide-containing units in a copolymer which is suitable for the present invention is determined by the requirement for a trouble-free, rapid development with aqueous, preferably aqueous-alkaline, solutions which are preferably free from organic solvents, and for the highest possible degree of resistance to overdevelopment of the exposed areas. To a small extent, these properties are also influenced by the mean molecular weight and the chemical and molecular nonuniformity of the polymer. In general, the acid number should not exceed 250, and preferably should vary between 50 and 220. In those cases where it is possible to use a developer that contains organic solvents, the acid number can be smaller.

The preferred terpolymers usually contain about 15 to 60% by weight, preferably about 20 to 50% by weight, of substituted acid amide units. The quantitative proportion of acrylic or methacrylic acid units is selected in accordance with the above-specified acid numbers; normally, it is about 10 to 35% by weight. The amount of alkyl acrylate or alkyl methacrylate is within the range of 25 to 75% by weight. Methacrylic acid in its free form or in the form of its alkyl ester is preferred over acrylic acid.

The quantitative proportion of binders in the polymerizable mixture is about 1 to 75% by weight, preferably 5 to 50% by weight, relative to the non-volatile constitutents of the mixture. The binders are preferably prepared by means of a free-radical polymerization in organic solvents, for example, butanone or ethanol. Optionally, low molecular weight, cross-linkable compounds, such as etherification products of hexahydroxymethylmelamine, particularly hexamethoxy-methyl-melamine, can be added. The added amount of these compounds can vary between 0.5 and 30% by weight, in particular up to 20% by weight, relative to the non-volatile constituents of the composition.

Polymeric diazonium salts of the sort employed in the compositions according to the present invention are compounds with recurring, diazonium salt group-containing units. Preference is thereby given to poly-con-densation products of aromatic diazonium salts which are capable of condensation, e.g., diphenylamine-4-diazonium salts, with carbonyl compounds capable of condensation, e.g., formaldehyde, or methylol compounds capable of condensation, and the ethers and esters thereof. It is also possible to use polymeric diazonium salts that are prepared by the polyaddition of diazonium salts or of precursors thereof, as described in European Patent Application No. 0 030 862, or by polymerizing diazonium salts or their precursors, as described in West German Auslegeschrift No. 11 14 704 and West German Offenlegungsschrift No. 33 43 536. The quantitative proportion of polymeric diazonium salt generally varies between 25 and 98% by weight, preferably between 50 and 95% by weight, relative to the non-volatile constituents of the composition.

Suitable diazonium salt polycondensation products are condensation products of aromatic diazonium salts capable of condensation, for example, diphenylamine-4-diazonium salts condensed with aldehydes, preferably with formaldehyde. It is particularly advantageous to use cocondensation products containing, in addition to the diazonium salt units, other units which are derived from compounds capable of condensation, particularly from aromatic amines, phenols, phenol ethers, aromatic thioethers, aromatic hydrocarbons, aromatic heterocyclic compounds and organic acid amides. Such condensation products are described in West German Offenlegungsschriften No. 20 24 244 and No. 33 11 435. Generally, all diazonium salt polycondensation products described in West German Offenlegungsschrift No. 27 39 774 are suitable.

Diazonium salt units A—$N_2X$ used to form the polymeric diazonium salts are preferably derived from compounds corresponding to the formula $(R^1-R^2-)_pR^3-N_2X$, in which X is the anion of the diazonium compound;

P is an integer from 1 to 3;

$R^1$ is an aromatic radical which is capable of condensation, in at least one position, with an active carbonyl compound;

$R^3$ is a substituted or unsubstituted phenylene group; and $R^2$ is a single bond or one of the following groups:
—$(CH_2)_q$—$NR^4$—,
—O—$(CH_2)_r$—$NR^4$—,
—S—$(CH_2)_r$—$NR^4$—,
—S—$CH_2CO$—$NR^4$—,
—O—$R^5$—O—,
—O—,
—S—, or
—CO—$NR^4$—, wherein
q is a number from 0 to 5,
r is a number from 2 to 5,
$R^4$ is a hydrogen atom, an alkyl group having from 1 to 5 carbon atoms, an aralkyl group having from 7 to 12 carbon atoms, or an aryl group having from 6 to 12 carbon atoms, and
$R^5$ is an arylene group having from 6 to 12 carbon atoms.

To stabilize the photosensitive composition of the present invention, it is advantageous to add a compound which is acid in character. Compounds that can be used include mineral acids and strong organic acids, with phosphoric acid, sulfuric acid, perchloric acid, boric acid and p-toluene sulfonic acid being preferred. Phosphoric acid is a particularly suitable acid.

Furthermore, other polymeric binders, dyes, pigments, leveling agents, surfactants and other customary additives can be incorporated, in known manner, into compositions according to the present invention.

Compositions of the present invention are preferably used in the production of photosensitive printing plates, in particular lithographic printing plates. The preferred layer supports in such applications are metals, such as zinc, steel, chromed steel, brass/chromium, copper/chromium or aluminum. For the production of lithographic printing plates, aluminum is preferably employed, in particular mechanically, chemically or electrolytically grained aluminum which is also preferably provided with an oxide layer produced by an anodic process.

Depending on the respective layer constituents, the following substances are examples of suitable solvents for preparing the coating solutions: alcohols, such as methanol and ethanol; glycol ethers, such as propylene glycol monoethyl ether; dimethyl formamide and diethyl formamide; ethers, such as dioxan and tetrahydrofuran; esters, such as ethyl acetate, butyl acetate, ethylene glycol methyl ether acetate; ketones, such as methyl ethyl ketone and cyclohexanone.

During processing, the copying material is imagewise exposed through an original. Any light source conventionally used in the copying art that emits radiation in the long-wave ultraviolet range, e.g., carbon arc lamps, mercury high-pressure lamps, pulsed xenon lamps and the like, can be employed for the imagewise exposure. Electron and laser irradiation can also be used for recording images.

After exposure, development is carried out by means of a suitable developer. Aqueous solutions of surfactants, optionally containing an alkali admixture, and mixtures thereof with organic solvents; aqueous salt solutions; aqueous acid solutions, e.g., solutions of phosphoric acids, which, in turn, may contain salts or organic solvents; and aqueous-alkaline developers, e.g., aqueous solutions of sodium salts of phosphoric acid or silicic acid, can be employed as developers. Organic solvents may also be added to these developers. In some cases it is also possible to use organic solvents that have been diluted with water. Further constituents, such as surfactants and hydrophilizing agents, may also be contained in the developers.

Development is performed conventionally, for example, by immersion into and/or by wiping or spraying with developer liquid. Unexposed layer areas are thereby removed.

The following examples illustrate the production of the photosensitive compositions according to the present invention, and of the recording materials prepared therewith. In the examples, parts by weight (p.b.w.) and parts by volume (p.b.v.) are related to each other as grams and milliliters. Unless otherwise specified, temperatures are indicated in C and percentages are expressed in terms of weight.

EXAMPLE 1

Coating solutions were prepared from
20 p.b.w. of the polycondensation product obtained from 1 mol of 3-methoxydiphenylamine-4-diazonium sulfate and 1 mol of 4,4'-bis-methoxymethyl diphenyl ether, precipitated as the mesitylene sulfonate,
1.8 p.b.w. of Victoria Pure Blue FGA (C.I. 42,595)
1 p.b.w. of $H_3PO_4$ (85%), and
6 p.b.w. of one of the resinous additives defined below, in
550 p.b.w. of 2-methoxy ethanol and
490 p.b.w. of tetrahydrofuran.

Each of these solutions was coated onto an electrochemically grained and anodically oxidized aluminum plate, which had additionally been treated with a 0.1% by weight strength solution of polyvinyl phosphonic acid before the coating solution was applied.

The following compounds were employed as additives:

(a) a terpolymer prepared from N-butoxymethyl-methacrylic acid amide, methacrylic acid and hexylmethacrylate (25:25:50), (b) a terpolymer prepared from N-butoxymethyl-methacrylic acid amide, acrylic acid and hexylmethacrylate (47:18:35), (c) a terpolymer prepared from styrene, methacrylic acid and hexylmethacrylate (10:30:60) (comparison), (d) the bis-glycidyl ether of 2,2-bis(p-hydroxyphenyl)-propane (comparison).

The presensitized printing plates prepared in this way, which had a layer weight of about 1.5 g/m² each, were imagewise exposed through a transparent negative original and subsequently developed with the following solution:
2 p.b.w. of Na-dodecylbenzene sulfonate,
1.5 p.b.w. of $K_2CO_3$,
1.5 p.b.w. of $KHCO_3$,
1.4 p.b.w. KOH
2 p.b.w. of Graham's salt,
4 p.b.w. of pelargonic acid
2 p.b.w. of poly-N-vinyl-N-methyl-acetamide,
3 p.b.w. of 2-phenoxy-ethanol, and
82.6 p.b.w. of water.

The developed printing plates were cut in two, and one half of each plate was baked at 230° C. for 5 minutes.

The plates were then used for printing in an offset press. The following numbers of quality prints were obtained.

|   | without baking | with baking |
| --- | --- | --- |
| a | 100,000 | 150,000 |
| b | 100,000 | 150,000 |
| c | 100,000 | 110,000 |

The table shows that the number of prints can be considerably increased by baking when the components according to the present invention are added to the copying layer. Because of the poor storability of the plate containing compound d, this material was not subjected to a printing test.

Sections of samples a, b, c and d were stored in a drying cabinet at 100° C. for 0.5, 1, 2, 3, and 4 hours, and then exposed through a test original and developed for 1 minute, as described above. Even after storage for 4 hours at 100° C., the quality of printing plates a, b and c did not deteriorate, whereas plate d could not be developed without scum after storage for 30 minutes at 100° C. Unlike samples a, b and c, a sample of plate d could not be developed without scum after a storage time of 4 weeks at room temperature.

Samples of printing plates a and c were exposed through a test original, which comprised a continuous tone step wedge having density increments of 0.15 and resolution test elements, by means of a 5 kW metal halide lamp placed at a distance of 110 cm. Samples of plates a and c were
(1) stored at room temperature for 10 minutes and then developed for 1 minute using the developer described above;
(2) heated to 100° C. for 10 minutes and then developed as above; or
(3) heated to 120° C. for 10 minutes and then developed as above.

The number of solid (crosslinked) steps achieved in each case is indicated in the table below:

| Treatment | Sample a | Sample c |
| --- | --- | --- |
| 10 minutes room temperature | 2 | 2 |
| 10 minutes 100° C. | 4 | 2 |
| 10 minutes 120° C. | 5 | 2 |

The table demonstrates that the photosensitivity of the material prepared in accordance with the present invention was increased by a post-heating treatment. Crosslinking of the completely exposed (completely hardened) and partially exposed (partly hardened) areas proceeded faster than in the unexposed areas. No deterioration of image resolution could be observed.

Comparably good results as in above-described Example 1a were achieved when the polymeric additive employed was
(e) a copolymer of N-butoxymethyl-methacrylic acid amide and acrylic acid amide (85:15) or
(f) a terpolymer of N-butoxymethyl-methacrylic acid amide, acrylic acid amide and hexylmethacrylate (30:20:50).

EXAMPLE 2

An aluminum plate, which had been mechanically grained by wire brushing, was coated with a solution of
2 p.b.w. of the polycondensation product obtained from 1 mol of 3-methoxy-diphenylamine-4-diazonium sulfate and 1 mol of formaldehyde, precipitated as tetrafluoroborate,
0.15 p.b.w. of Victoria Pure Blue FGA (C.I. 42,595),
0.2 p.b.w. of phosphoric acid (85%) and
1 p.b.w. of one of the polymers described below, in
    30 p.b.w. of dimethylformamide,
    29 p.b.w. of 2-methoxy-ethanol and
    20 p.b.w. of tetrahydrofuran
and then dried for 2 minutes at 110° C.

The following polymers were employed:
(a) a terpolymer prepared from a n-hexylmethacrylate, methacrylic acid and N-butoxymethyl-methacrylamide (36:28:36);
(b) a terpolymer prepared from n-hexylmethacrylate, methacrylic acid and styrene (60:30:10) (comparison).

The plates were exposed, and one half of each plate was then heated to 210° C. for 5 minutes. Thereafter, the resistance of each plate to solvents was tested. For this purpose, the plates were wiped for 1 minute with cotton pads which had been soaked with dimethyl sulfoxide, and were then judged.

|   | not heated | heated |
| --- | --- | --- |
| a | strong attack, layer detached | no substantial attack |
| b | as (a) | attack, layer detached |

Similar results were achieved when the even more aggressive solvent dimethyl formamide was used, i.e., the layer according to the present invention was thermally crosslinkable and was resistant after crosslinking.

When the above diazonium salt polycondensation product was replaced by a polycondensation product which was obtained from 1 mol of 3-methoxy-diphenylamine-4-diazonium sulfate and 1 mol of 4,4'-bis-methoxymethyl-diphenyl ether, precipitated as the tetrafluoroborate; or was obtained from 0.8 mol of 2,5-dimethoxy-4-(p-tolylmercapto)-benzene diazonium sulfate, 0.2 mol of diphenylamine-4-diazonium sulfate and 1 mol of formaldehyde, precipitated as the tetrafluoroborate, it was also possible to obtain thermal crosslinking after the addition of a binder according to the present invention. A considerably increased resistance to chemical and chemical/mechanical attacks was thus achieved.

EXAMPLE 3

An electrochemically grained and anodically oxidized aluminum plate was coated with a solution of
2 p.b.w. of the diazonium salt polycondensation product specified in Example 1,
2 p.b.w. of a terpolymer obtained from N-butoxymethyl-methacrylamide, methacrylic acid and ethyl acrylate (31:32:37),
0.2 p.b.w. of Victoria Pure Blue FGA (C.I. 42,595), and
0.1 p.b.w. of phosphoric acid (85%), in
50 p.b.w. of 2-methoxy-ethanol and
35 p.b.w. of tetrahydrofuran
A layer weight of 1.2 g/m$^2$ was obtained after drying. The printing plate was exposed through a test original and developed with the developer of Example 1. Half of the plate was heated to 230° C. for 5 minutes.

The heated and the non-heated sample were together mounted on an offset press. In a comparative simultaneous print test, the wear of the partially exposed (partly hardened) steps of a continuous-tone step wedge of the plate which was not a post-heated plate was much greater than was observed in the case of the post-heated plate. The unheated plate became unuseable after about 110,000 to 120,000 prints, i.e., it produced gray prints of poor contrast, whereas the heated plate still printed images that were reproduced in great detail and showed good ink transfer properties.

Comparable results were achieved using terpolymers obtained from N-butoxymethyl-methacrylamide, methacrylic acid and decylmethacrylate (23:30:47); and using N-butoxymethyl-methacrylamide, acrylic acid and hexylmethacrylate (26:22:52).

EXAMPLE 4

An electrochemically grained and anodically oxidized aluminum plate was coated with a solution of
2 p.b.w. of a cocondensate obtained from 1 mol of 3-methoxy-diphenylamine-4-diazonium sulfate, 1 mol of 4-methoxy-methyl-4'-methyl-diphenyl ether and 1 mol of 4,4'-bis-methoxymethyl-diphenyl ether, precipitated as the mesitylene sulfonate,
0.2 p.b.w. of a terpolymer obtained from styrene, n-hexyl-methacrylate and methacrylic acid (10:60:30, molecular weight 35,000),
0.1 p.b.w. of a copolymer of N-methoxymethyl methacrylamide and n-hexylmethacrylate (50:50),
0.2 p.b.w. of hexamethoxymethyl melamine,
0.2 p.b.w. of Victoria Pure Blue FGA (C.I. 42, 595) and
0.2 p.b.w. of phosphoric acid (85%), in 55 p.b.w. of 2-methoxy-ethanol and
35 p.b.w. of tetrahydrofuran.

A layer weight of 0.8 g/m² was obtained. The plate was exposed through a test original and developed with the following solution:
15 p.b.w. of pelargonic acid,
10 p.b.w. of sodium hydroxide,
92 p.b.w. of a block polymer comprising 90% of propylene oxide and 10% of ethylene oxide, and
12 p.b.w. of sodium tetrapolyphosphate, in
550 p.b.w. of water.

The plate was then heated to 210° C. for 10 minutes. It yielded very high print runs of excellent quality.

What is claimed is:

1. A photosensitive composition consisting of, in admixture, from 25 to 98% by weight of a polymeric, photosensitive diazonium salt and from 1 to 75% by weight of a polymeric binder that is a copolymer comprised of (i) from 15 to 60% by weight of units represented by the formula

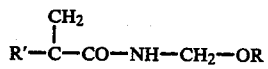

wherein
R denotes a hydrogen atom, a lower alkyl group, a lower acyl group or a lower hydroxyalkyl group and
R' is a hydrogen atom or a methyl group, and (ii) units comprising carboxylic groups in an amount such that the acid number of said polymeric binder is from 50 to 220, said photosensitive composition being thermally curable after imagewise photoexposure and washing out of the unexposed areas with an aqueous alkaline developer solution.

2. A photosensitive composition as claimed in claim 1 wherein the polymeric diazonium salt is a diazonium salt polycondensation product.

3. A photosensitive mixture as claimed in claim 2, wherein the diazonium salt polycondensation product is comprised of recurring units A—N₂X and B which are linked by intermediate groups, wherein A is a radical of an aromatic diazonium compound capable of condensation with formaldehyde, and B is a radical of a diazonium group-free compound capable of condensation with formaldehyde.

4. A photosensitive mixture as claimed in claim 3, wherein said intermediate groups are methylene groups derived from carbonyl compounds capable of condensation.

5. A photosensitive mixture as claimed in claim 3, wherein the diazonium group-free compound is selected from the group consisting of an aromatic amine, a phenol, a phenol ether, an aromatic thioether, an aromatic hydrocarbon, an aromatic heterocyclic compound and an organic acid amide.

6. A photosensitive composition as claimed in claim 1, wherein said copolymer further comprises units possessing lateral carboxylic acid amide groups.

7. A photosensitive composition as claimed in claim 1, wherein said copolymer is a terpolymer of
(a) methacrylic acid or acrylic acid,
(b) an acrylamide or methacrylamide carrying ROCH₂-groups at the nitrogen, and
(c) an alkyl acrylate or alkyl methacrylate.

8. A photosensitive composition as claimed in claim 7, wherein said terpolymer comprises 10 to 35% by weight of units derived from acrylic acid or methacrylic acid, 15 to 60% by weight of units derived from substituted acrylamide or substituted methacrylamide, and 25 to 75% by weight of units derived from an alkyl acrylate or alkyl methacrylate.

9. A photosensitive recording material consisting essentially of a layer support and a photosensitive layer, said photosensitive layer consisting of, in admixture, from 25 to 98% by weight of a polymeric, photosensitive diazonium salt and from 1 to 75% by weight of a polymeric binder which comprises (i) from 15 to 60% by weight of units represented by the formula

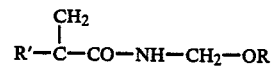

wherein
R denotes a hydrogen atom, a lower alkyl group, a lower acyl group or a lower hydroxyalkyl group and
R' is a hydrogen atom or a methyl group, and (ii) units comprising carboxylic groups in an amount such that the acid number of said polymeric binder is from 50 to 220, said photosensitive layer being thermally curable after imagewise photo-exposure and washing out of the unexposed areas with an aqueous alkaline developer solution.

10. A photosensitive recording material as claimed in claim 9, wherein said recording material is a lithographic printing plate.

11. A photosensitive composition consisting of, in admixture:
from 25 to 98% by weight of a polymeric, photosensitive diazonium salt;
at least one member selected from the group consisting of a polymeric binder, a dye, a pigment, a leveling agent, a surfactant, and an acid stabilizer; and
from 1 to 75% by weight of a polymeric binder that is a copolymer having
(i) from 15 to 60% by weight of units represented by the formula

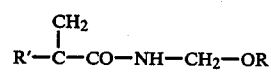

wherein R denotes a hydrogen atom, a lower alkyl group, a lower acyl group or a lower hydroxyalkyl group, and R' is a hydrogen atom or a methyl group; and
(ii) units comprising carboxylic groups in an amount such that the acid number of said polymeric binder is from 50 to 220, said photosensitive composition being thermally curable after imagewise photoexposure and washing out of the unexposed areas with an aqueous alkaline developer solution.

12. A photosensitive recording material consisting essentially of a layer support and a photosensitive layer, said photosensitive layer consisting of, in admixture:
from 25 to 98% by weight of a polymeric, photosensitive diazonium salt;
at least one member selected from the group consisting of a polymeric binder, a dye, a pigment, a leveling agent, a surfactant, and an acid stabilizer; and
from 1 to 75% by weight of a polymeric binder which has (i) from 15 to 60% by weight of units represented by the formula

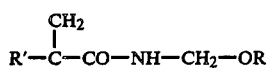

wherein R denotes a hydrogen atom, a lower alkyl group, a lower acyl group or a lower hydroxyalkyl group, and R' is a hydrogen atom or a methyl group; and (ii) units comprising carboxylic groups in an amount such that the acid number of said polymeric binder is from 50 to 220, said photosensitive layer being thermally curable after imagewise photoexposure and washing out of the unexposed areas with an aqueous alkaline developer solution.

* * * * *